US012804813B2

United States Patent
(12) United States Patent
Hirowatari

(10) Patent No.: US 12,804,813 B2
(45) Date of Patent: Nov. 17, 2026

(54) SEMICONDUCTOR MODULE WITH EXTENDED INTERNAL TERMINAL

(71) Applicant: FUJI ELECTRIC CO., LTD., Kawasaki (JP)

(72) Inventor: Miku Hirowatari, Matsumoto-city (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 240 days.

(21) Appl. No.: 18/753,939

(22) Filed: Jun. 25, 2024

(65) Prior Publication Data

US 2025/0048551 A1 Feb. 6, 2025

(30) Foreign Application Priority Data

Aug. 4, 2023 (JP) ................................ 2023-128140

(51) Int. Cl.
*H05K 1/11* (2006.01)
*H05K 7/14* (2006.01)

(52) U.S. Cl.
CPC ........... *H05K 1/115* (2013.01); *H05K 7/1427* (2013.01)

(58) Field of Classification Search
CPC ... H05K 1/115; H05K 7/1427; H10W 90/701; H10W 90/00; H10W 76/157; H10W 70/658; H10W 90/401; H10W 70/611
USPC .......................................................... 174/262
See application file for complete search history.

(56) References Cited

U.S. PATENT DOCUMENTS 4,861,944 A * 8/1989 Jones .................. H10W 70/635 174/265
2018/0338376 A1 11/2018 Terashima
2019/0103329 A1 4/2019 Aoki et al.

FOREIGN PATENT DOCUMENTS

JP H06-291230 A 10/1994
JP H07-335801 A 12/1995
JP 2010-016289 A 1/2010
JP 2012-069649 A 4/2012
JP 2017-084553 A 5/2017
JP 2018-195714 A 12/2018
JP 2019-067885 A 4/2019
JP 2021-197490 A 12/2021

* cited by examiner

*Primary Examiner* — Timothy J Thompson
*Assistant Examiner* — Michael F McAllister
(74) *Attorney, Agent, or Firm* — Rabin & Berdo, P.C.

(57) ABSTRACT

A semiconductor module includes a printed circuit board and an internal terminal unit. The internal terminal unit includes an internal terminal group including a plurality of internal terminals that are aligned in a predetermined direction and each have a first width in the predetermined direction, and an extended internal terminal that has a step portion formed by a first portion having the first width and a second portion having a second width greater than the first width in the predetermined direction and that supports the printed circuit board by the second portion. The extended internal terminal is located at a first end of the internal terminal unit that is opposite to a second end of the internal terminal unit in the predetermined direction. The second portion extends from the first portion in the predetermined direction from the second end toward the first end of internal unit.

7 Claims, 16 Drawing Sheets

SEMICONDUCTOR MODULE WITH EXTENDED INTERNAL TERMINAL

CROSS-REFERENCE TO RELATED APPLICATION

This application is based upon and claims the benefit of priority of the prior Japanese Patent Application No. 2023-128140, filed on Aug. 4, 2023, the entire contents of which are incorporated herein by reference.

BACKGROUND OF THE INVENTION

1. Field of the Invention

The embodiment discussed herein relates to a semiconductor module.

2. Background of the Related Art

In a semiconductor module a guide pin protruding externally from the top surface of an enclosure has at least one level difference in a height direction from the top surface of the enclosure to a tip farthest from the enclosure (see, for example, Japanese Laid-open Patent Publication No. 2018-195714). Furthermore, the height from the top surface of an insulated circuit board to the top surface of a support portion is greater than the height from the top surface of the insulated circuit board to the top surface of a semiconductor chip (see, for example, Japanese Laid-open Patent Publication No. 2021-197490).

In addition, terminals at both ends of a plurality of terminals attached in line to the body of a package are tapered. An end portion of each tapered terminal has a third surface opposite to a second surface which faces an adjacent terminal, and the third surface has the shape of steps (see, for example, Japanese Laid-open Patent Publication No. 2010-016289). Moreover, an element holding means includes a terminal holding portion which holds terminals of a high heat generating element and a non-conductor, together with the high heat generating element, positioned and fixed on a heat sink (see, for example, Japanese Laid-open Patent Publication No. 2012-069649).

Furthermore, an internal wiring printed circuit board is incorporated in a package and a conductor pattern of an insulating board and an auxiliary terminal are connected via the printed circuit board (see, for example, Japanese Laid-open Patent Publication No. H07-335801). In addition, before a main terminal and a signal terminal are soldered onto a radiation plate, an intermediate portion of each terminal is soldered in advance onto a printed circuit board. Next, an assembly including the printed circuit board and the terminals is mounted on the radiation plate and a lower end of each terminal is soldered onto the radiation plate (see, for example, Japanese Laid-open Patent Publication No. H06-291230).

Moreover, a connection terminal is provided, which includes a conduction portion connected to an electronic part and a press-fit portion repulsively inserted into a conductive penetration hole made in a circuit board, the press-fit portion having a protrusion which may engage with the penetration hole in a pulling direction (see, for example, Japanese Laid-open Patent Publication No. 2017-84553).

SUMMARY OF THE INVENTION

According to an aspect, there is provided a semiconductor module, including a printed circuit board having a plurality of through holes; and an internal terminal unit including an internal terminal group including a plurality of internal terminals that are aligned in a predetermined direction and each have a first width in the predetermined direction, a part of each of the plurality of internal terminals passing through a corresponding one of the plurality of through holes of the printed circuit board, and an extended internal terminal that has a step formed by a first portion having the first width and a second portion having a second width greater than the first width in the predetermined direction, a part of the first portion passing through one of the plurality of through holes of the printed circuit board to support the printed circuit board by the second portion, wherein: the extended internal terminal is located at a first end of the internal terminal unit that is opposite to a second end of the internal terminal unit in the predetermined direction; and the second portion further extends from the first portion in the predetermined direction from the second end toward the first end of the internal terminal unit.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described by reference to the accompanying drawings.

In the following description, a "front surface" or an "upper surface" indicates an X-Y plane which faces the upper side (+Z direction), for example, in a semiconductor module 10 illustrated in FIG. 1 and FIG. 2. Similarly, an "upside" indicates the upward direction (+Z direction), for example, in the semiconductor module 10 illustrated in FIG. 1 and FIG. 2. A "back surface" or a "lower surface" indicates the X-Y plane which faces the lower side (−Z direction), for example, in the semiconductor module 10 illustrated in FIG. 1 and FIG. 2. Similarly, a "downside" indicates the downward direction (−Z direction), for example, in the semiconductor module 10 illustrated in FIG. 1 and FIG. 2. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction.

Figure 1:
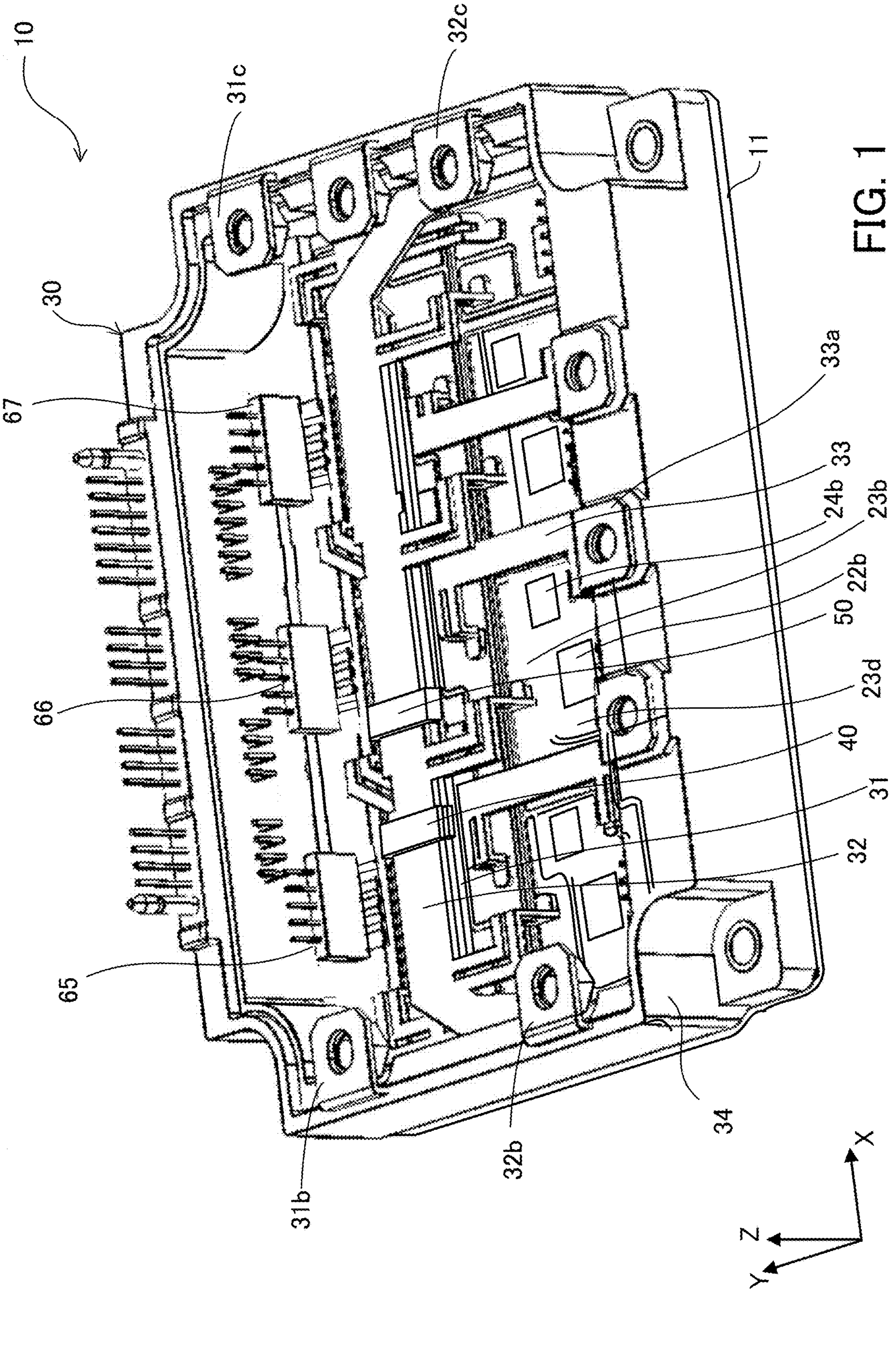
FIG. 1 is a perspective view of a semiconductor module.

FIG. 1 is a perspective view of a semiconductor module. Furthermore, FIG. 2 is a plan view of the semiconductor module. FIG. 1 and FIG. 2 illustrate a semiconductor module 10 including the function of a three-phase inverter circuit. The semiconductor module 10 includes a metal base 11, a first insulating board 21*a*, a second insulating board 21*b*, a case (terminal case) 30, a first insulating member 40, and a second insulating member 50.

The metal base 11 is used for dissipating heat generated by the semiconductor module 10 and contains, as a main ingredient, metal, such as copper, aluminum, or an alloy containing at least one of them, having high thermal conductivity. In order to improve the corrosion resistance of the metal base 11, plating treatment may be performed. At this time, nickel, a nickel-phosphorus alloy, a nickel-boron alloy, or the like is used as a plating material.

The first insulating board 21*a* and the second insulating board 21*b* are located over the metal base 11. For example, the first insulating board 21*a* and the second insulating board 21*b* are fixed onto the metal base 11 with solder. The first insulating board 21*a* and the second insulating board 21*b* are made of a ceramic, such as aluminum oxide, aluminum nitride, or silicon nitride, having high thermal conductivity.

Figure 2:
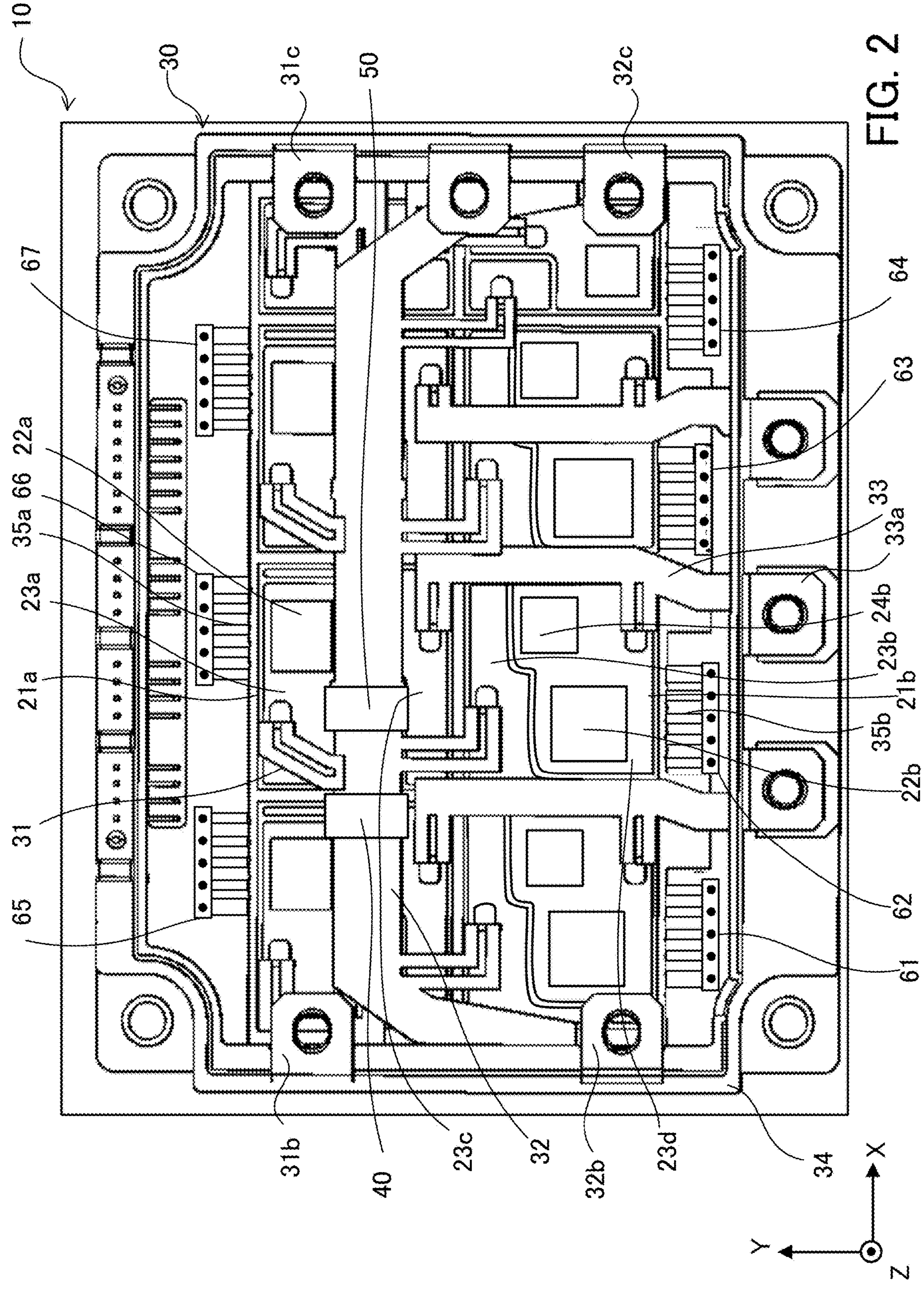
FIG. 2 is a plan view of the semiconductor module.

As illustrated in FIG. 2, a first semiconductor element 22*a* and a first conductive plate 23*a* electrically connected thereto are located over the front surface of the first insulating board 21*a*. Similarly, a second semiconductor element 22*b* and a second conductive plate 23*b* electrically connected thereto are located over the front surface of the second insulating board 21*b*.

Each of the first semiconductor element 22*a* and the second semiconductor element 22*b* illustrated in FIG. 2 is a switching element such as a power metal oxide semiconductor field effect transistor (MOSFET) or an insulated gate bipolar transistor (IGBT). The first semiconductor element 22*a* and the second semiconductor element 22*b* function as an upper-arm switching element and a lower-arm switching element respectively. If a power MOSFET is used, then such a switching element has on the back surface a drain electrode, which is an input electrode, as a main electrode and has on the front surface a gate electrode, which is a control electrode, and a source electrode, which is an output electrode.

If an IGBT is used, then such a switching element has on the back surface a collector electrode, which is an input electrode, as a main electrode and has on the front surface a gate electrode, which is a control electrode, and an emitter electrode, which is an output electrode.

Each of the first semiconductor element 22*a* and the second semiconductor element 22*b* may be a reverse conducting (RC)-IGBT. An RC-IGBT has both of the function of an IGBT and the function of a free wheeling diode (FWD) which is a diode element. Furthermore, of the first each semiconductor element 22*a* and the second semiconductor element 22*b* may be a power MOSFET made of silicon carbide. Furthermore, a body diode of a power MOSFET (which may be made of silicon carbide) may perform the same function that is carried out by an FWD of an RC-IGBT.

The first conductive plate 23*a* is included in a circuit pattern formed over the front surface of the first insulating board 21*a*. The second conductive plate 23*b* is included in a circuit pattern formed over the front surface of the second insulating board 21*b*. These circuit patterns are made of metal, such as copper or a copper alloy, having good electrical conductivity.

The number or shape of the circuit patterns is properly selected according to, for example, the specifications of the semiconductor module 10. A direct copper bonding (DCB) substrate, an active metal brazed (AMB) substrate, or the like may be used as each of the first insulating board 21*a* and the second insulating board 21*b* over which the above circuit patterns are formed.

In addition, internal terminal units 61 through 67 are located on the bottom of the case 30 and are integrally formed with the case 30 made of resin. Usually, molding is performed by using a thermoplastic resin as such resin. To be concrete, super-engineering plastic such as non-crystalline polyarylate, polysulfone, polyethersulfone, polyphenylene sulfide, polyether ether ketone, polyimide, polyether imide, or liquid crystal polymer, engineering plastic such as polyacetal, polyamide, polycarbonate, modified polyphenylene ether, polubutylene terephthalate, glass fiber reinforced polyethylene terephthalate, ultra high molecular weight polyethylene, or syndiotactic polyethylene, polyethylene, polypropylene, polyvinyl chloride, polystyrene, polyvinyl acetate, Teflon (registered trademark), acrylonitrile butadiene styrene, acryl, or the like is used.

Alternatively, a thermosetting resin may be used as such resin. To be concrete, epoxy resin, silicone resin, acrylic resin, urethane resin, phenolic resin, melamine resin, urea resin, unsaturated polyester resin, alkyd resin, or the like is used. However, another material, such as a ceramic, may be used.

On the other hand, the back surface of the first semiconductor element 22*a* is bonded to the front surface of the first conductive plate 23*a* with solder or the like. As a result, the first semiconductor element 22*a* and the first conductive plate 23*a* are electrically connected.

The output electrode of the first semiconductor element 22*a* is electrically connected to a third conductive plate 23*c* included in the circuit pattern formed over the front surface of the first insulating board 21*a*. The gate electrode of the first semiconductor element 22*a* is electrically connected to a control terminal 35*a* of the internal terminal unit 66 located on the case 30. A wiring member, such as a bonding wire, is used for electrical connection (not illustrated).

The output electrode of the second semiconductor element 22*b* is electrically connected to the second conductive plate 23*b* by a wiring member such as a bonding wire (not illustrated). The gate electrode of the second semiconductor element 22*b* is also electrically connected to a control terminal 35*b* of the internal terminal unit 62 located on the case 30 by a wiring member such as a bonding wire (not illustrated).

The back surface of the second semiconductor element 22*b* is bonded with solder or the like to the front surface of a fourth conductive plate 23*d* included in the circuit pattern formed over the front surface of the second insulating board 21*b*.

Another semiconductor element may be located over each of the first insulating board 21*a* and the second insulating board 21*b*. In FIG. 1 and FIG. 2, a semiconductor element 24*b*, which includes a diode, is located over the second insulating board 21*b*. The diode is a Schottky barrier diode (SBD), a P-intrinsic-N (PiN) diode, or the like. The diode is connected in inverse parallel with the switching element as an FWD. The semiconductor element 24*b* has on the back surface an output electrode (cathode electrode) as a main electrode and has on the front surface an input electrode (anode electrode) as a main electrode.

The back surface of the semiconductor element 24*b* is bonded to the front surface of the fourth conductive plate 23*d* with solder. The input electrode on the front surface of the semiconductor element 24*b* is electrically connected to the second conductive plate 23*b* by a wiring member such as a bonding wire (not illustrated).

In FIG. 1 and FIG. 2, the same semiconductor element that includes a diode is also located over the first insulating board 21*a* and is hidden under a second lead frame 32 (−Z direction). Three pairs of first and second insulating boards 21*a* and 21*b* are arranged in the X direction over the metal base 11. The above semiconductor elements and conductive plates are located over each first insulating board 21*a* and each second insulating board 21*b*. Furthermore, an insulating board over which a brake circuit and the like are formed may be located over the metal base 11.

With the case 30 a first lead frame 31, the second lead frame 32, a third lead frame 33, and various terminals including the above control terminals 35*a* and 35*b* are integrally molded with an enclosure 34 having the shape of a frame.

The first lead frame 31, the second lead frame 32, and the third lead frame 33 are external connection terminals for main current. The first lead frame 31 includes a first wiring portion extending in parallel with the front surfaces of the first insulating board 21*a* and the second insulating board 21*b* and is bonded to the first conductive plate 23*a*.

The first lead frame 31 is bonded to the first conductive plate 23*a* by solder bonding, ultrasonic bonding, or the like. Both ends of the first lead frame 31 function as terminal portions 31*b* and 31*c*. The terminal portions 31*b* and 31*c* are exposed from the top of the enclosure 34 and the front surface of a lid (not illustrated) of the semiconductor module 10.

The second lead frame 32 includes a second wiring portion extending right over the front surface of the first wiring portion with a gap between them in a direction (X direction) in which the first wiring portion extends. Furthermore, the second lead frame 32 is bonded to the second conductive plate 23*b*. The second lead frame 32 is bonded to the second conductive plate 23*b* by solder bonding, ultrasonic bonding, or the like.

Both ends of the second lead frame 32 function as terminal portions 32*b* and 32*c*. The terminal portions 32*b* and 32*c* are exposed from the top of the enclosure 34 and the front surface of the lid (not illustrated) of the semiconductor module 10.

The third lead frame 33 is bonded to the third conductive plate 23*c* and the fourth conductive plate 23*d*. The third lead frame 33 is bonded to the third conductive plate 23*c* and the fourth conductive plate 23*d* by solder bonding, ultrasonic bonding, or the like. One end of the third lead frame 33 functions as a terminal portion 33*a*. The terminal portion 33*a* is exposed from the top of the enclosure 34. The terminal portion 33*a* functions as one (U terminal, a V terminal, or a W terminal) of output terminals of the semiconductor module 10.

The first lead frame 31, the second lead frame 32, and the third lead frame 33 are made of a material, such as aluminum, iron, silver, copper, or an alloy containing at least one of them, having good electrical conductivity.

Figure 3:
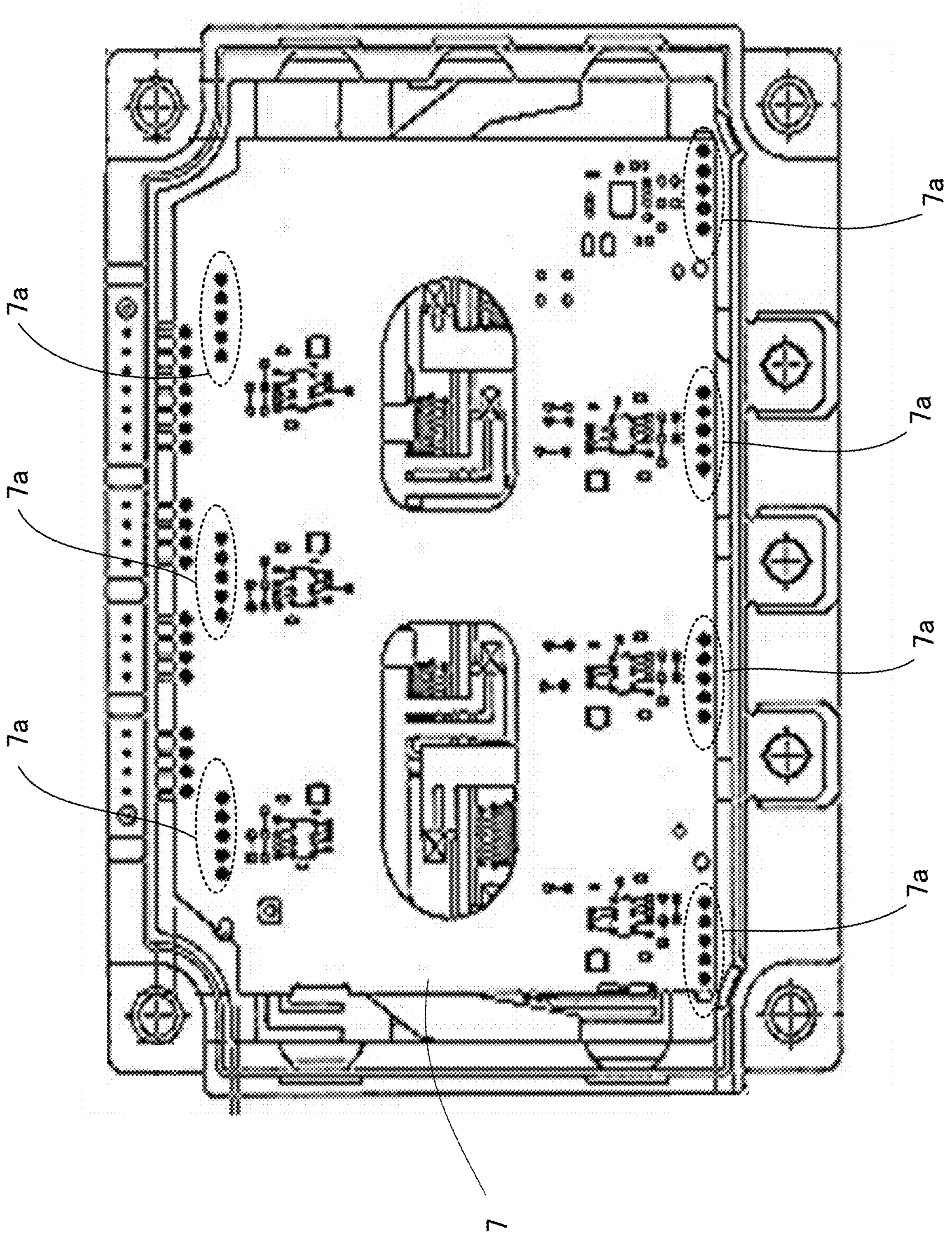
FIG. 3 is a plan view of the semiconductor module in which a printed circuit board is supported.

FIG. 3 is a plan view of the semiconductor module in which a printed circuit board is supported. A printed circuit board 7 includes an insulating board and a plurality of upper circuit patterns formed over the front surface thereof. Various circuit elements are mounted over each circuit pattern. Furthermore, the printed circuit board 7 may include a plurality of lower circuit patterns formed on the back surface of the insulating board at need. In addition, the printed circuit board 7 may include an internal layer circuit pattern inside the printed circuit board 7.

For example, the printed circuit board 7 is a through hole board and a plurality of holes 7*a* which pierce the printed circuit board 7 from the front surface to the back surface are made at positions corresponding to internal terminals and extended internal terminals included in the internal terminal units 61 through 67 and described later.

Furthermore, a level difference portion (step) described later is formed on each extended internal terminal. Internal terminals and extended internal terminals are inserted into holes 7*a* of the printed circuit board 7, and the printed circuit board 7 is pushed in to the level difference portions formed on the extended internal terminals. As a result, the printed circuit board 7 is supported. The semiconductor module 10 has in this way a two-layer structure of the first insulating boards 21*a* and the second insulating boards 21*b* and the printed circuit board 7.

Figure 4:
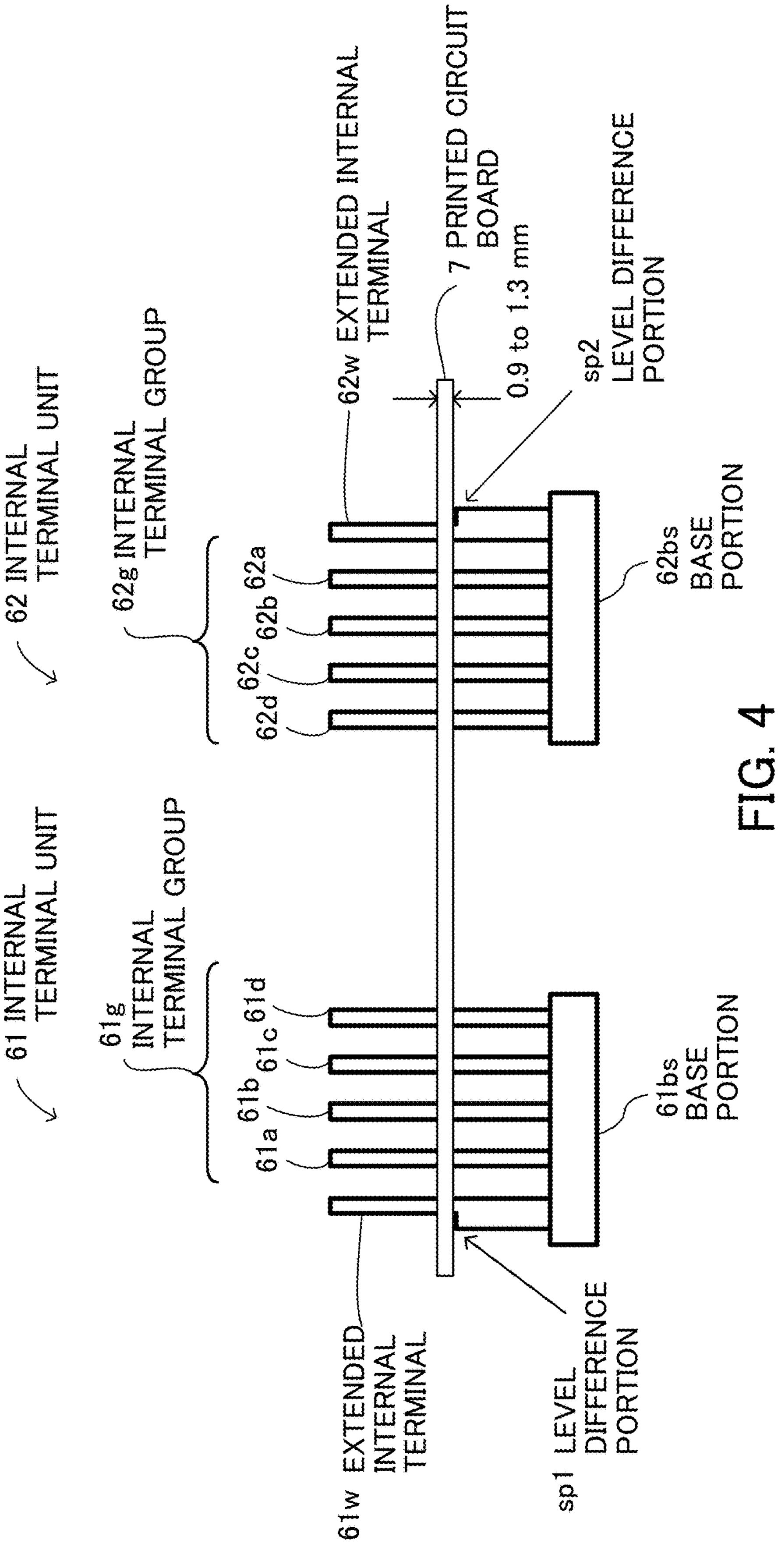
FIG. 4 illustrates an example of the structure of internal terminal units.

FIG. 4 illustrates an example of the structure of internal terminal units. The internal unit 61 includes an internal terminal group 61*g* including a plurality of internal terminals 61*a*, 61*b*, 61*c*, and 61*d* and an extended internal terminal 61*w* with respect to a base portion 61*bs*.

The base portion 61*bs* is made of resin, is integrated with the case 30 made of resin, and is mounted in the case 30. Furthermore, if the extended internal terminal 61*w* is formed in the internal terminal unit 61, then the extended internal terminal 61*w* is formed in an end portion of the internal terminal unit 61.

The internal terminal unit 62 includes an internal terminal group 62*g* including a plurality of internal terminals 62*a*, 62*b*, 62*c*, and 62*d* and an extended internal terminal 62*w* with respect to a base portion 62*bs*. The base portion 62*bs* is made of resin, is integrated with the case 30 made of resin, and is mounted in the case 30. Furthermore, if the extended internal terminal 62*w* is formed in the internal terminal unit 62, then the extended internal terminal 62*w* is formed in an end portion of the internal terminal unit 62.

The extended internal terminal 61*w* includes a level difference portion sp1 and the extended internal terminal 62*w* includes a level difference portion sp2. The internal terminals and the extended internal terminals are inserted into holes 7*a* made in the printed circuit board 7 and the printed circuit board 7 is pushed in to the level difference portions sp1 and sp2 formed on the extended internal terminals 61*w* and 62*w* respectively. As a result, the printed circuit board 7 is supported on the level difference portions sp1 and sp2. In addition, the thickness of the printed circuit board 7 is about 0.9 to 1.3 mm.

Figure 5:
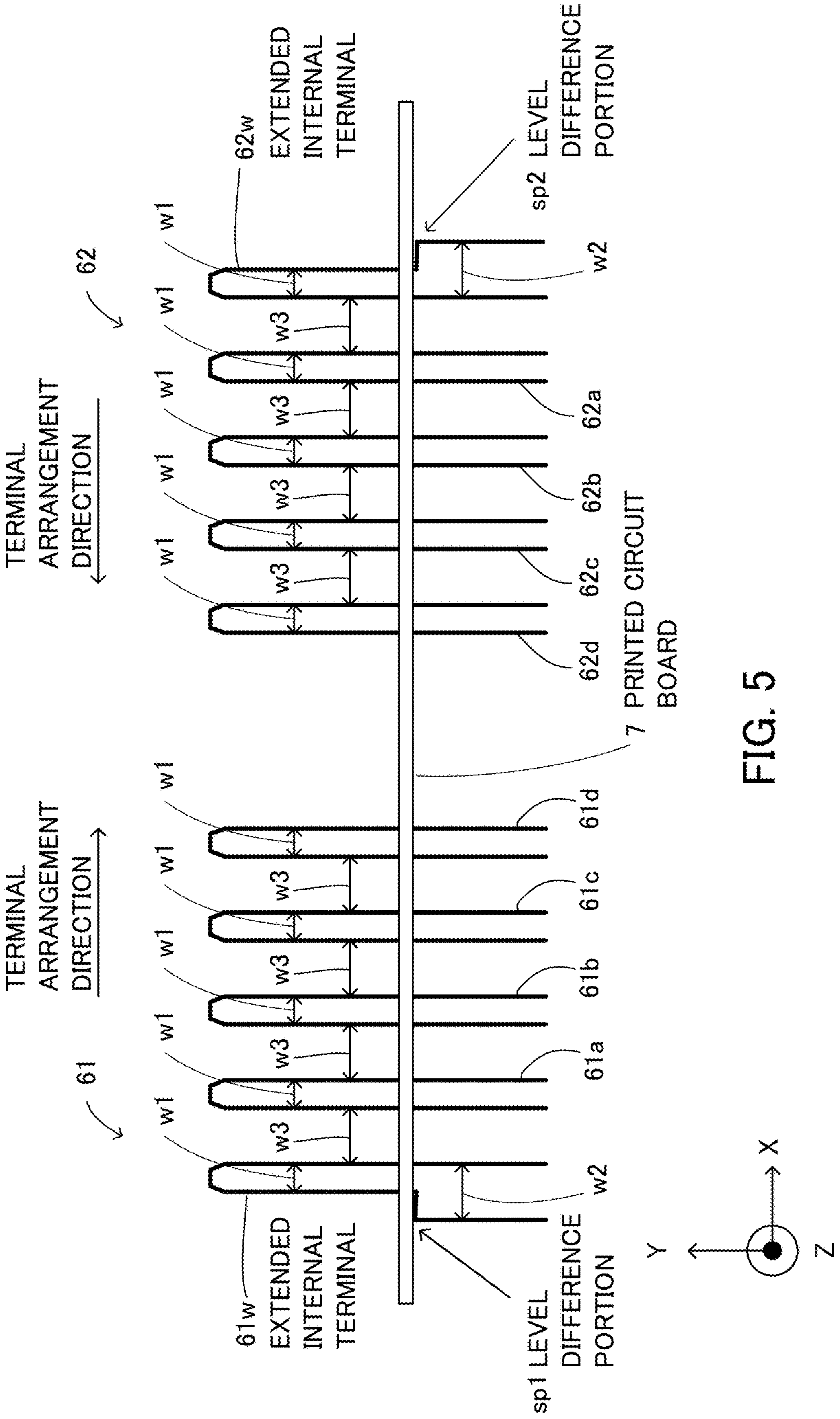
FIG. 5 is a view for describing a level difference portion.

FIG. 5 is a view for describing a level difference portion. In the internal terminal unit 61, the internal terminals 61*a* through 61*d* and the extended internal terminal 61*w* have a first pin width w1 (first width). Furthermore, the level difference portion sp1 of the extended internal terminal 61*w* has a second pin width w2 (second width) obtained by expanding the first pin width w1 in one direction. Moreover, a width w3 (third width) between the internal terminals 61*a* through 61*d* and the extended internal terminal 61*w* in the internal terminal unit 61 is constant and is larger than the first pin width w1. As a result, insulation distance between the terminals is ensured.

The level difference portion sp1 is formed by expanding the first pin width w1 in a direction opposite to a terminal arrangement direction of the internal terminals 61*a* through 61*d* with the end portion of the internal terminal unit 61 in which the extended internal terminal 61*w* is situated as a starting point (level difference portion sp1 is not formed perpendicularly to the terminal arrangement direction). The level difference portion sp1 of the extended internal terminal 61*w* is formed in this way by expanding the first pin width w1 in −X direction in FIG. 5. As a result, insulation distance between the internal terminal 61*a* and the extended internal terminal 61*w* is ensured.

Similarly, in the internal terminal unit 62, the internal terminals 62*a* through 62*d* and the extended internal terminal 62*w* have the first pin width w1. Furthermore, the level difference portion sp2 of the extended internal terminal 62*w* has the second pin width w2 obtained by expanding the first pin width w1 in one direction. Moreover, the width w3 between the internal terminals 62*a* through 62*d* and the extended internal terminal 62*w* in the internal terminal unit 62 is constant and is larger than the first pin width w1. As a result, insulation distance between the terminals is ensured.

The level difference portion sp2 is formed by expanding the first pin width w1 in a direction opposite to a terminal arrangement direction of the internal terminals 62*a* through 62*d* with the end portion of the internal terminal unit 62 in which the extended internal terminal 62*w* is situated as a starting point (level difference portion sp2 is not formed perpendicularly to the terminal arrangement direction). The level difference portion sp2 of the extended internal terminal 62*w* is formed in this way by expanding the first pin width w1 in X direction in FIG. 5. As a result, insulation distance between the internal terminal 62*a* and the extended internal terminal 62*w* is ensured.

Figure 6:
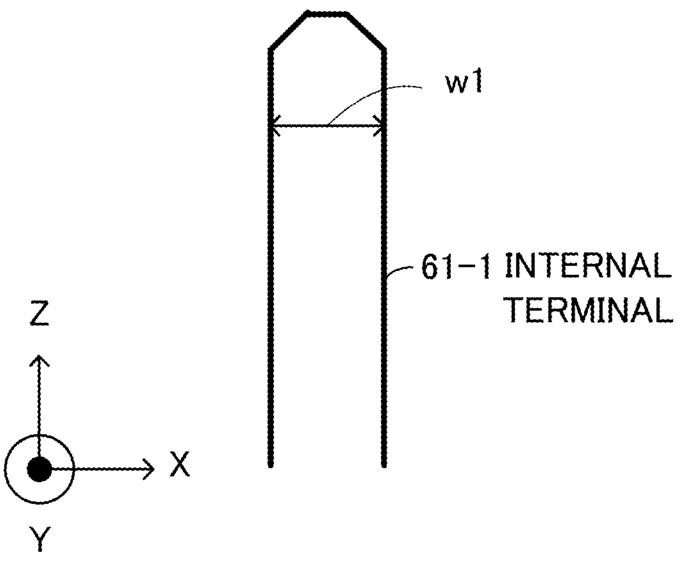
FIG. 6 illustrates a pin width of an internal terminal.
Figure 7A:
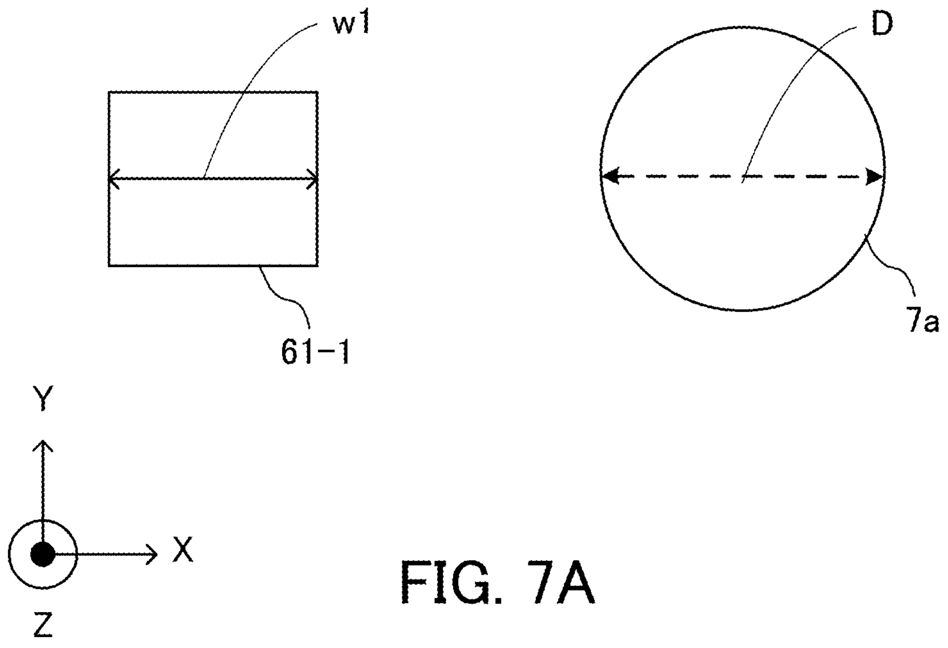
FIGS. 7A and 7B illustrate the relationship between an internal terminal and a hole size of a printed circuit board, FIG. 7A being a plan view of the internal terminal and a hole of the printed circuit board, FIG. 7B being a plan view illustrative of a state in which the internal terminal is inserted into the hole of the printed circuit board.
Figure 7B:
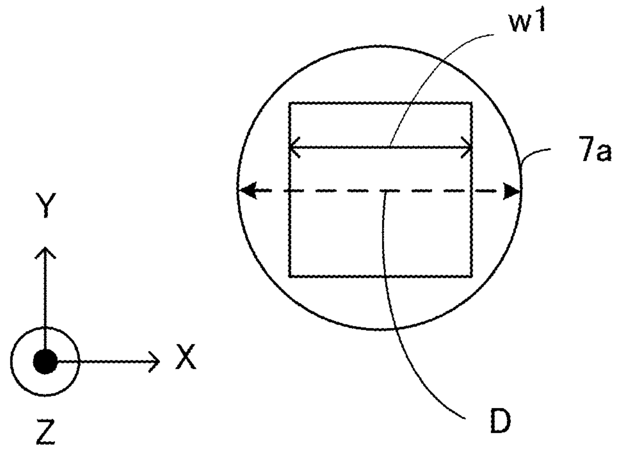

FIG. 6 illustrates a pin width of an internal terminal. FIGS. 7A and 7B illustrate the relationship between an internal terminal and a hole size of a printed circuit board. FIG. 7A is a plan view of the internal terminal and a hole of the printed circuit board. FIG. 7B is a plan view illustrative of a state in which the internal terminal is inserted into the hole of the printed circuit board.

The first pin width w1 of the internal terminals 61*a* through 61*d* (referred to as the internal terminals 61-1 if they are generically named) included in the internal terminal group 61*g* is smaller than the size (hole size) of the holes 7*a* of the printed circuit board 7. That is to say, it is assumed that the diameter of the holes 7*a* is D. Then w1<D. Therefore, the internal terminals 61-1 pierce the holes 7*a* of the printed circuit board 7.

Similarly, the first pin width w1 of the internal terminals 62*a* through 62*d* (not illustrated and referred to as the internal terminals 62-1 if they are generically named) included in the internal terminal group 62*g* is also smaller than the size of the holes 7*a* of the printed circuit board 7. Therefore, the internal terminals 62-1 pierce the holes 7*a* of the printed circuit board 7.

Figure 8:
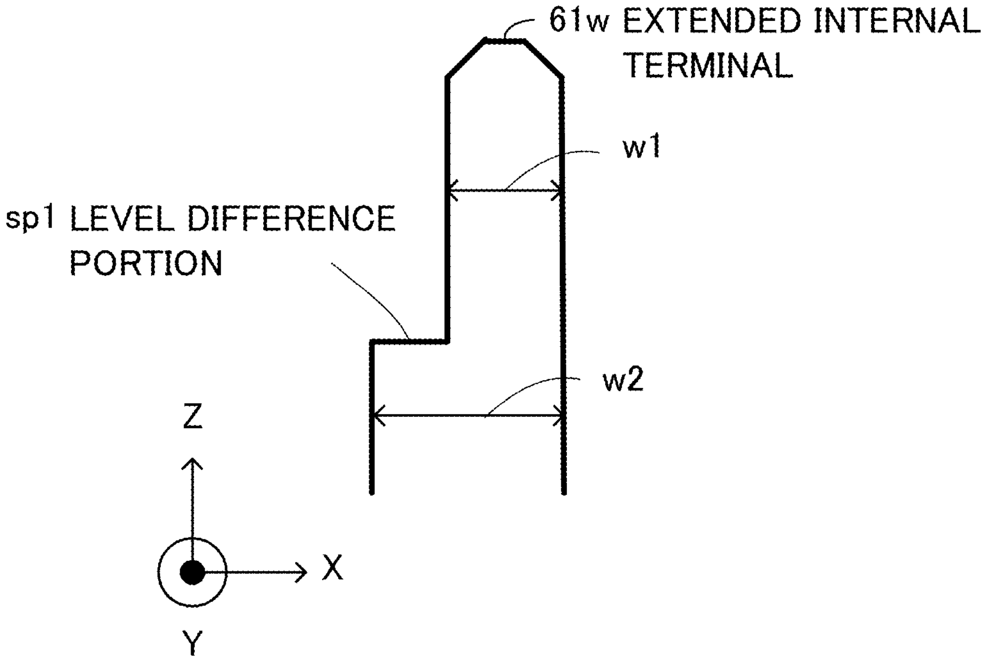
FIG. 8 illustrates a pin width of an extended internal terminal.
Figure 9A:
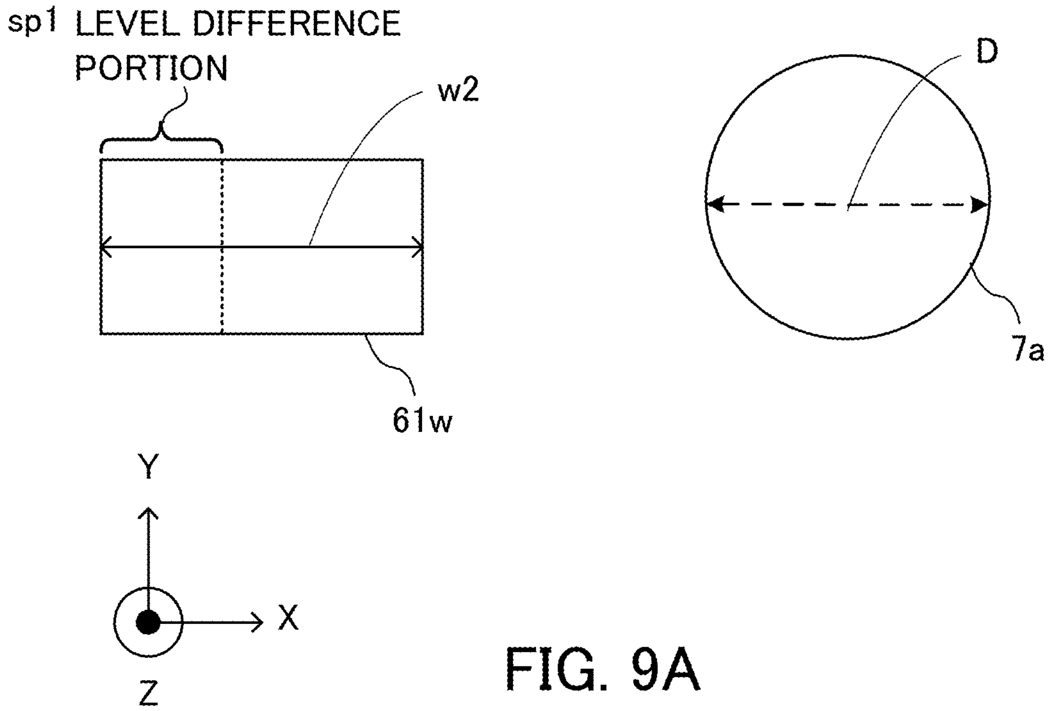
FIGS. 9A and 9B illustrate the relationship between the extended internal terminal and a hole size of the printed circuit board, FIG. 9A being a plan view of the extended internal terminal and a hole of the printed circuit board, FIG. 9B being a plan view illustrative of a state in which the extended internal terminal is inserted into the hole of the printed circuit board.
Figure 9B:
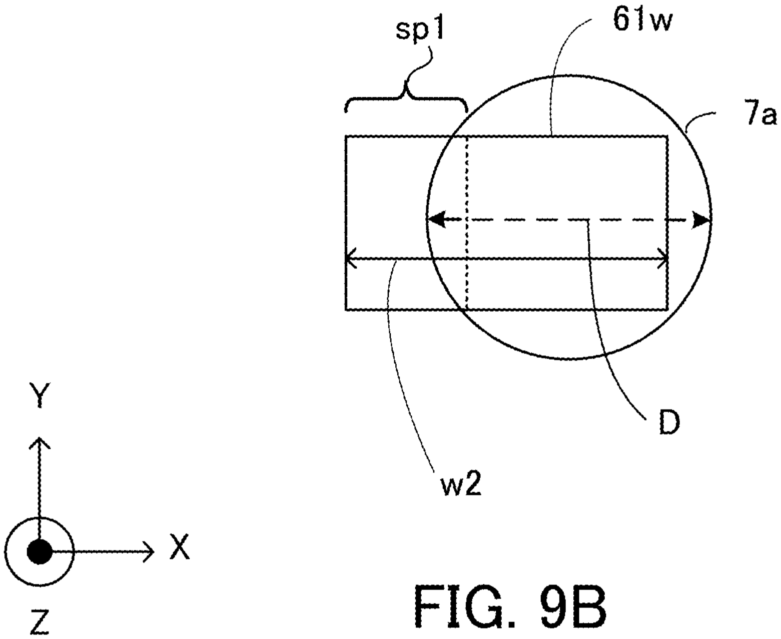

FIG. 8 illustrates a pin width of an extended internal terminal. FIGS. 9A and 9B illustrate the relationship between the extended internal terminal and a hole size of the printed circuit board. FIG. 9A is a plan view of the extended internal terminal and a hole of the printed circuit board. FIG. 9B is a plan view illustrative of a state in which the extended internal terminal is inserted into the hole of the printed circuit board.

The second pin width w2 of the extended internal terminal 61*w* is larger in −X direction than the size of the hole 7*a* of the printed circuit board 7. That is to say, the second pin width w2 of the extended internal terminal 61*w* is larger than the diameter D of the hole 7*a*. Because D<w2, the level difference portion sp1 of the extended internal terminal 61*w* does not pierce the hole 7*a* of the printed circuit board 7. Furthermore, even if there is a slight deviation in alignment between the holes 7*a* and the internal terminals, the printed circuit board 7 is stably supported.

Similarly, the second pin width w2 of the extended internal terminal 62*w* is larger in X direction than the size of the hole 7*a* of the printed circuit board 7 (not illustrated). That is to say, the second pin width w2 of the extended internal terminal 62*w* is larger than the diameter D of the hole 7*a*. Because D<w2, the level difference portion sp2 of the extended internal terminal 62*w* does not pierce the hole 7*a* of the printed circuit board 7. Furthermore, even if there is a slight deviation in alignment between the holes 7*a* and the internal terminals, the printed circuit board 7 is stably supported.

In order to stably support the printed circuit board 7, it is preferable to locate per printed circuit board 7 at least three internal terminal units each including an extended internal terminal on which the above level difference portion is formed at a moderate distance from one another. Furthermore, if there are no limitations such as insulation distance, then four or more internal terminal units each including an extended internal terminal on which the above level difference portion is formed may be located.

Figure 10:
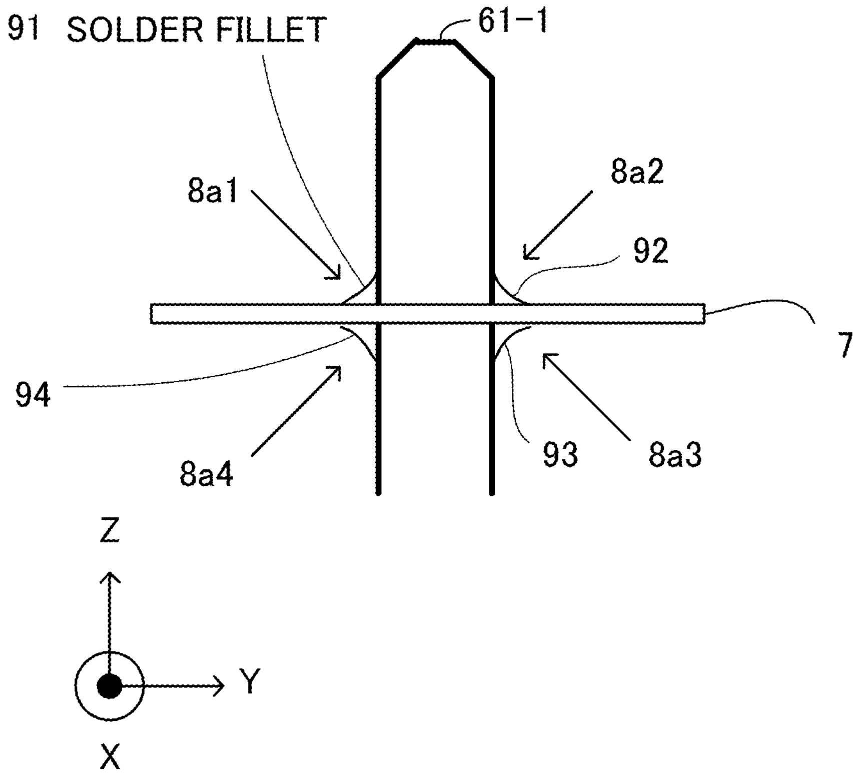
FIG. 10 illustrates an example of solder bonding between an internal terminal and a hole of the printed circuit board.

FIG. 10 illustrates an example of solder bonding between an internal terminal and a hole of the printed circuit board. The internal terminals 61-1 are bonded to the holes 7*a* of the printed circuit board 7 with solder in a position in which the printed circuit board 7 is supported on a level difference portion of each extended internal terminal. The same amount of solder fillets 91 through 94 are ensured at all bonding portions 8a1 through 8a4 of solder bonding between the internal terminals 61-1 and the holes 7a of the printed circuit board 7 and the solder fillets 91 through 94 (first solder fillets) are equally formed. The bonding portions 8a1 and 8a2 correspond to the hole front surface of the printed circuit board 7 and the bonding portions 8a3 and 8a4 correspond to the hole back surface of the printed circuit board 7.

Figure 11:
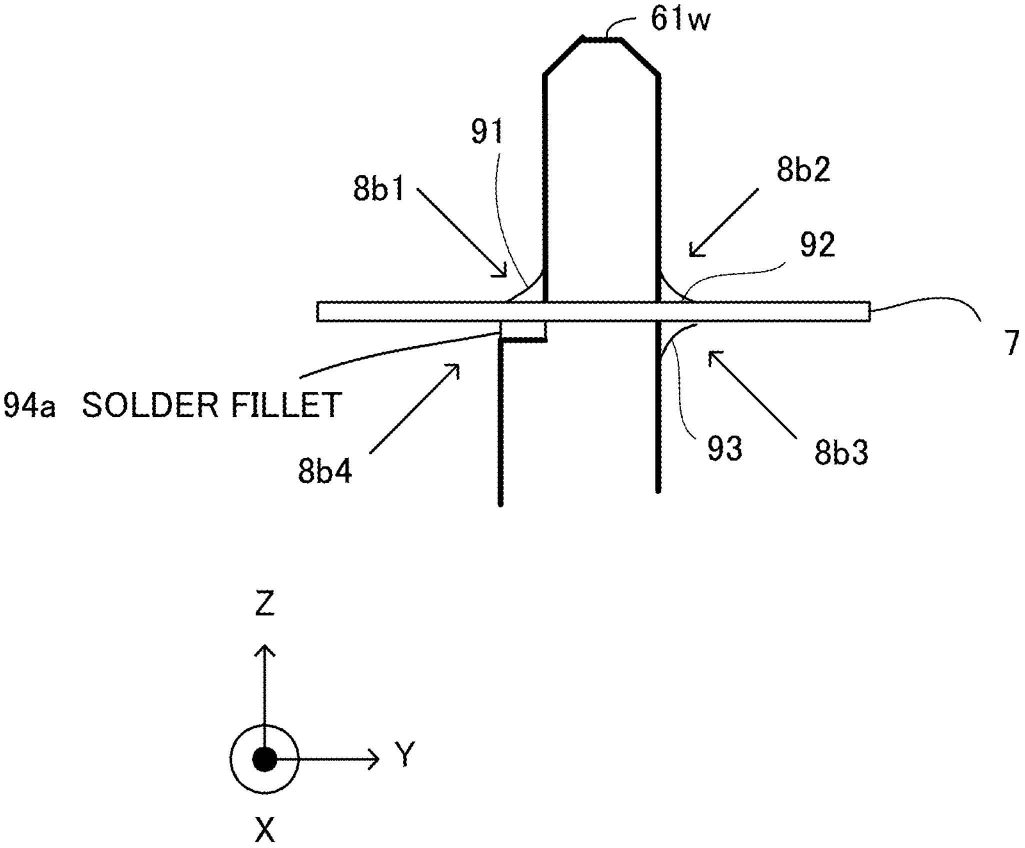
FIG. 11 illustrates an example of solder bonding between an extended internal terminal and a hole of the printed circuit board.

FIG. 11 illustrates an example of solder bonding between an extended internal terminal and a hole of the printed circuit board. The extended internal terminal 61w is bonded to the hole 7a of the printed circuit board 7 with solder in a position in which the printed circuit board 7 is supported on a level difference portion of each extended internal terminal. Solder fillets 91, 92, and 93 are equally formed at bonding portions 8b1, 8b2, and 8b3 of solder bonding between the extended internal terminal 61w and the hole 7a of the printed circuit board 7. The bonding portions 8b1 and 8b2 correspond to the hole front surface of the printed circuit board 7 and the bonding portion 8b3 corresponds to the hole back surface of the printed circuit board 7.

On the other hand, the amount of a solder fillet 94a (second solder fillet) at a bonding portion 8a4 including the level difference portion sp1 is smaller than those of the solder fillets 91, 92, and 93 in the bonding. The bonding portion 8b4 corresponds to the hole back surface of the printed circuit board 7. Solder bonding is performed in this way in a position in which the printed circuit board 7 is supported on the level difference portion of each extended internal terminal. As a result, the printed circuit board 7 is stably fixed and supported.

Figure 12A:
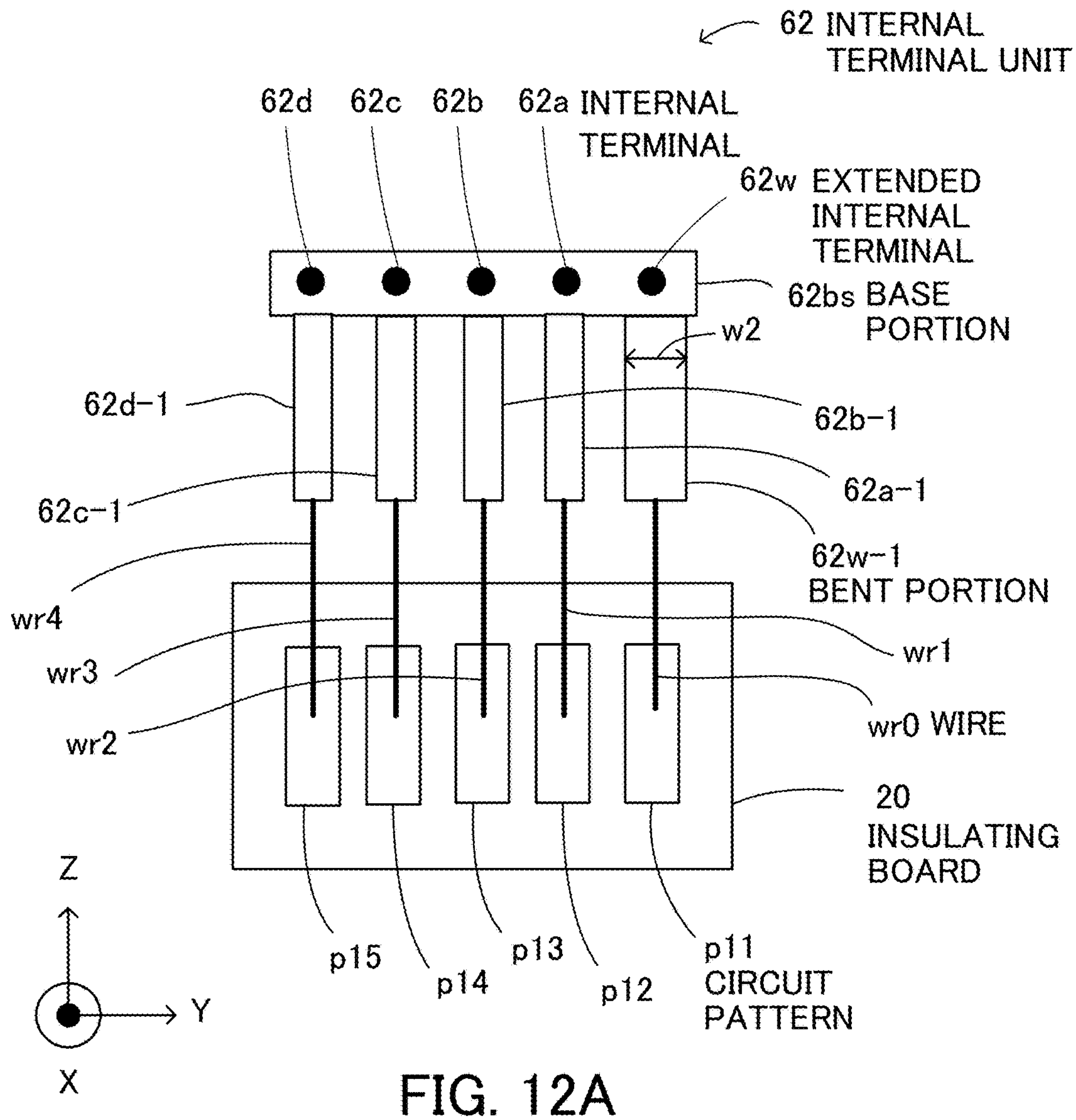
FIGS. 12A and 12B illustrate a state in which an internal terminal unit is bonded to circuit patterns over an insulating board, FIG. 12A being a plan view of the internal terminal unit, FIG. 12B being a side view of the internal terminal unit which supports the printed circuit board.
Figure 12B:
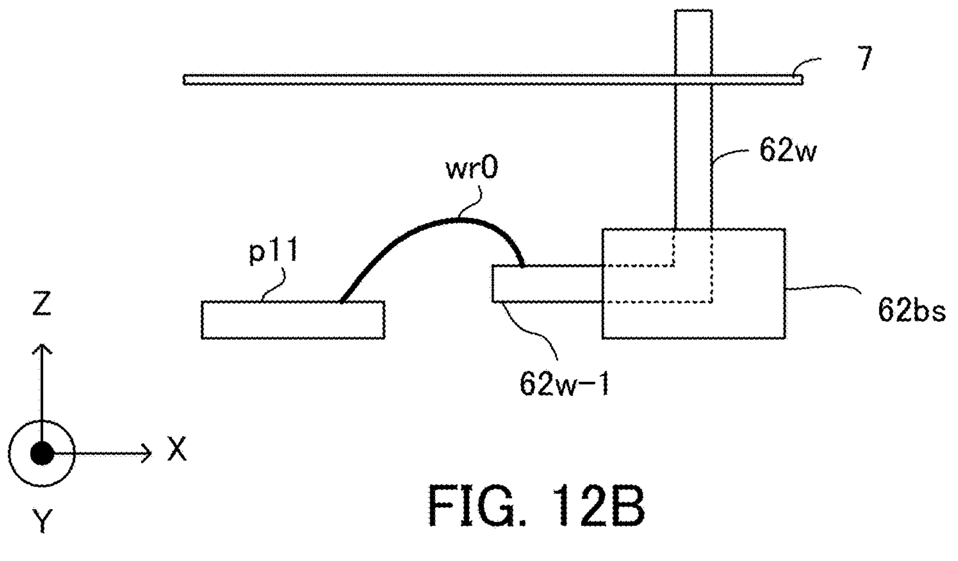

FIGS. 12A and 12B illustrate a state in which an internal terminal unit is bonded to circuit patterns over an insulating board. FIG. 12A is a plan view of the internal terminal unit. FIG. 12B is a side view of the internal terminal unit which supports the printed circuit board. In the internal terminal unit 62, the extended internal terminal 62w and the internal terminals 62a, 62b, 62c, and 62d are bent perpendicularly to the terminal arrangement direction inside the base portion 62bs.

If the width direction (direction of the second pin width w2) of the extended internal terminal 62w is an X-axis direction or a Z-axis direction, then strength needed to form a bend of a wide terminal increases and it is difficult to form a bend of the extended internal terminal 62w at the same timing when bends of the other internal terminals 62a, 62b, 62c, and 62d are formed. On the other hand, with the extended internal terminal 62w according to this embodiment, a width is formed in a Y-axis direction and a level difference portion is formed. Therefore, it is easy to bend the extended internal terminal 62w in a direction from an X-axis to a Z-axis. To the extended internal terminal 62w, the following structure is adopted. That is to say, the extended internal terminal 62w has a wide portion and is easy to be bent to form a bent portion 62w-1.

On the other hand, the bent portion 62w-1 of the extended internal terminal 62w protruding outward from the base portion 62bs and bent portions 62a-1, 62b-1, 62c-1, and 62d-1 of the internal terminals 62a, 62b, 62c, and 62d protruding outward from the base portion 62bs are wire-bonded respectively to circuit patterns formed over an insulating board.

That is to say, the bent portion 62w-1 of the extended internal terminal 62w is connected via a wire wr0 to a circuit pattern p11 formed over an insulating board 20. Furthermore, the bent portion 62a-1 of the internal terminal 62a is connected via a wire wr1 to a circuit pattern p12 formed over the insulating board 20 and the bent portion 62b-1 of the internal terminal 62b is connected via a wire wr2 to a circuit pattern p13 formed over the insulating board 20.

In addition, the bent portion 62c-1 of the internal terminal 62c is connected via a wire wr3 to a circuit pattern p14 formed over the insulating board 20 and the bent portion 62d-1 of the internal terminal 62d is connected via a wire wr4 to a circuit pattern p15 formed over the insulating board 20.

Figure 13:
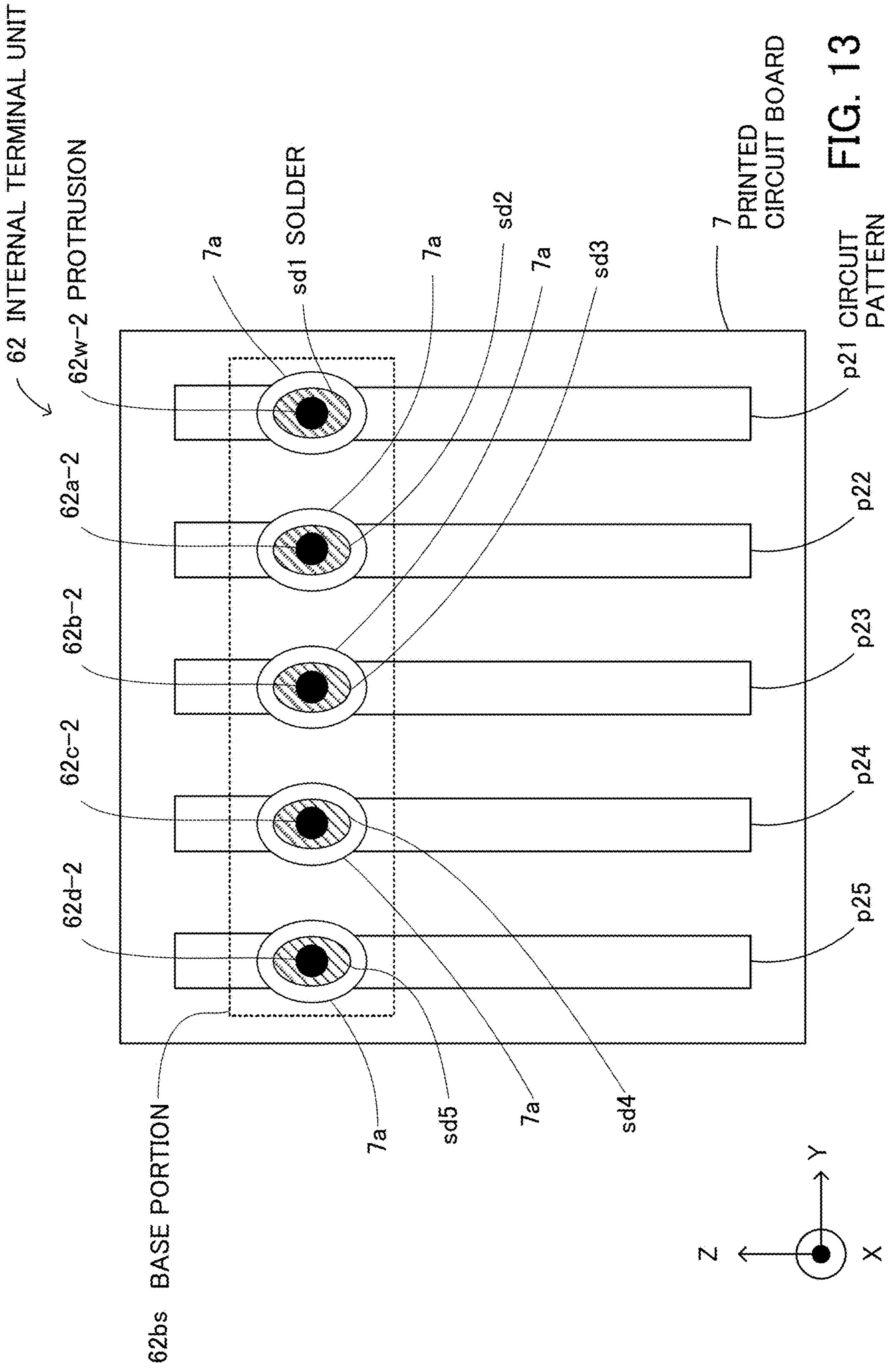
FIG. 13 illustrates a state in which an internal terminal unit is bonded to circuit patterns over the printed circuit board.
Figure 14:
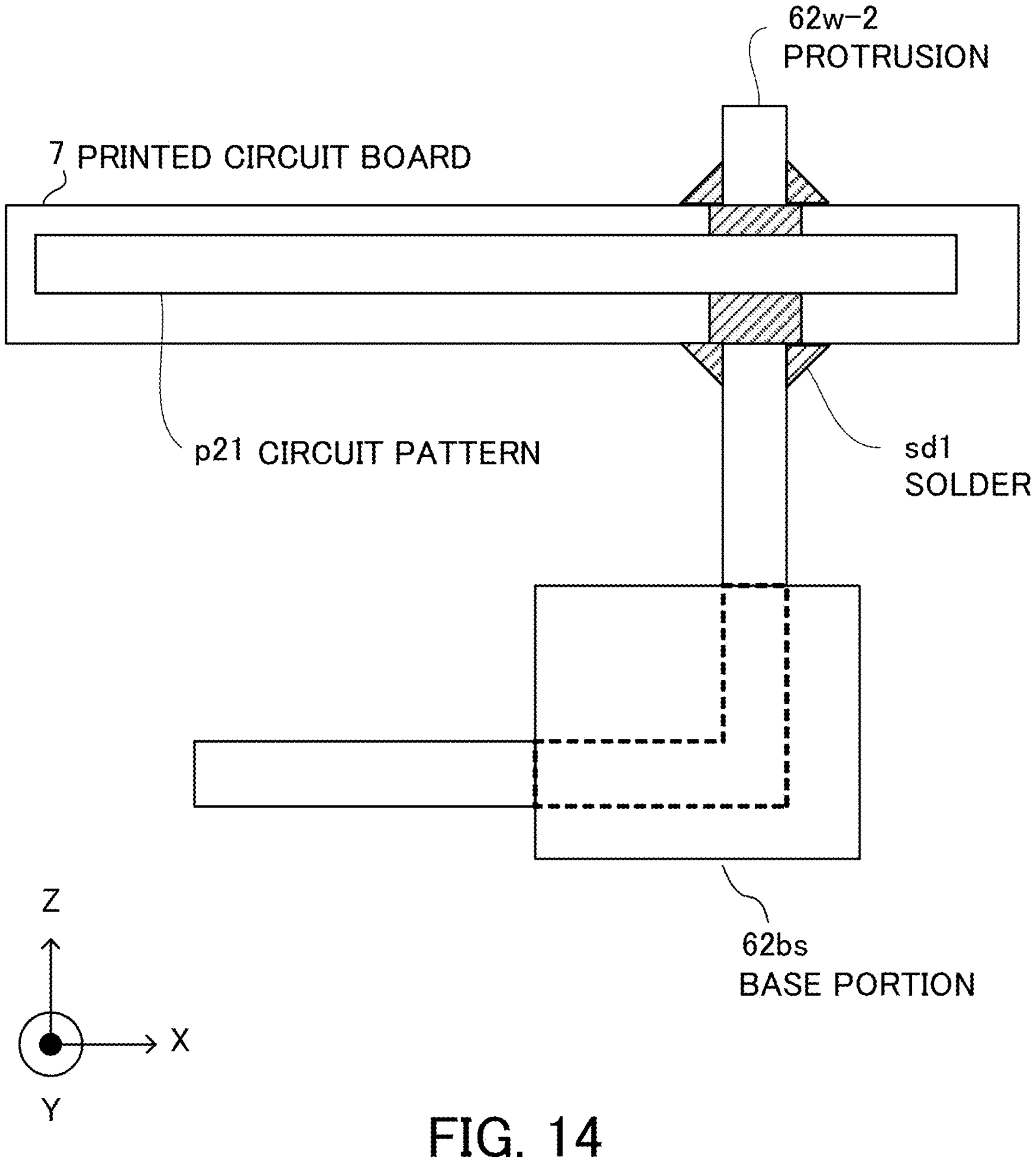
FIG. 14 illustrates a state in which the internal terminal unit is bonded to the circuit patterns over the printed circuit board.

FIGS. 13 and 14 illustrate a state in which an internal terminal unit is bonded to circuit patterns over the printed circuit board. FIG. 13 is a plan view of the internal terminal unit in the case of the printed circuit board being supported. FIG. 14 is a side view of the internal terminal unit in the case of the printed circuit board being supported.

The extended internal terminal 62w of the internal terminal unit 62 includes a protrusion 62w-2 protruding from the front surface of the printed circuit board 7. Furthermore, the internal terminals 62a, 62b, 62c, and 62d include protrusions 62a-2, 62b-2, 62c-2, and 62d-2, respectively, protruding from the front surface of the printed circuit board 7.

The protrusion 62w-2 and the protrusions 62a-2, 62b-2, 62c-2, and 62d-2 are solder-bonded in holes 7a to circuit patterns (internal layer circuit patterns) formed inside the printed circuit board 7. That is to say, the protrusion 62w-2 is bonded in a hole 7a with solder sd1 to a circuit pattern p21.

Furthermore, the protrusion 62a-2 is bonded in a hole 7a with solder sd2 to a circuit pattern p22 and the protrusion 62b-2 is bonded in a hole 7a with solder sd3 to a circuit pattern p23.

In addition, the protrusion 62c-2 is bonded in a hole 7a with solder sd4 to a circuit pattern p24 and the protrusion 62d-2 is bonded in a hole 7a with solder sd5 to a circuit pattern p25.

Figure 15:
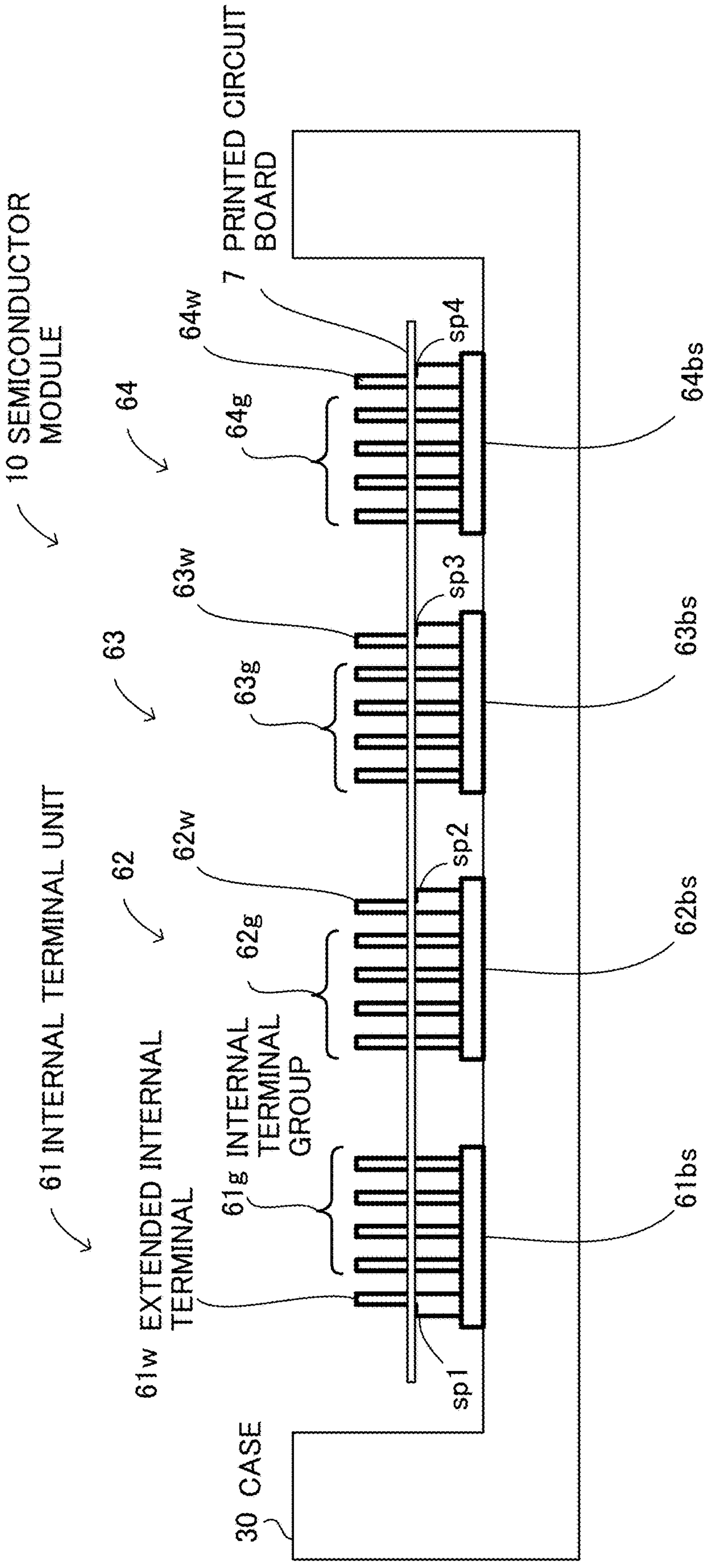
FIG. 15 illustrates an example of a structure according to an embodiment in which the printed circuit board is supported.
Figure 16:
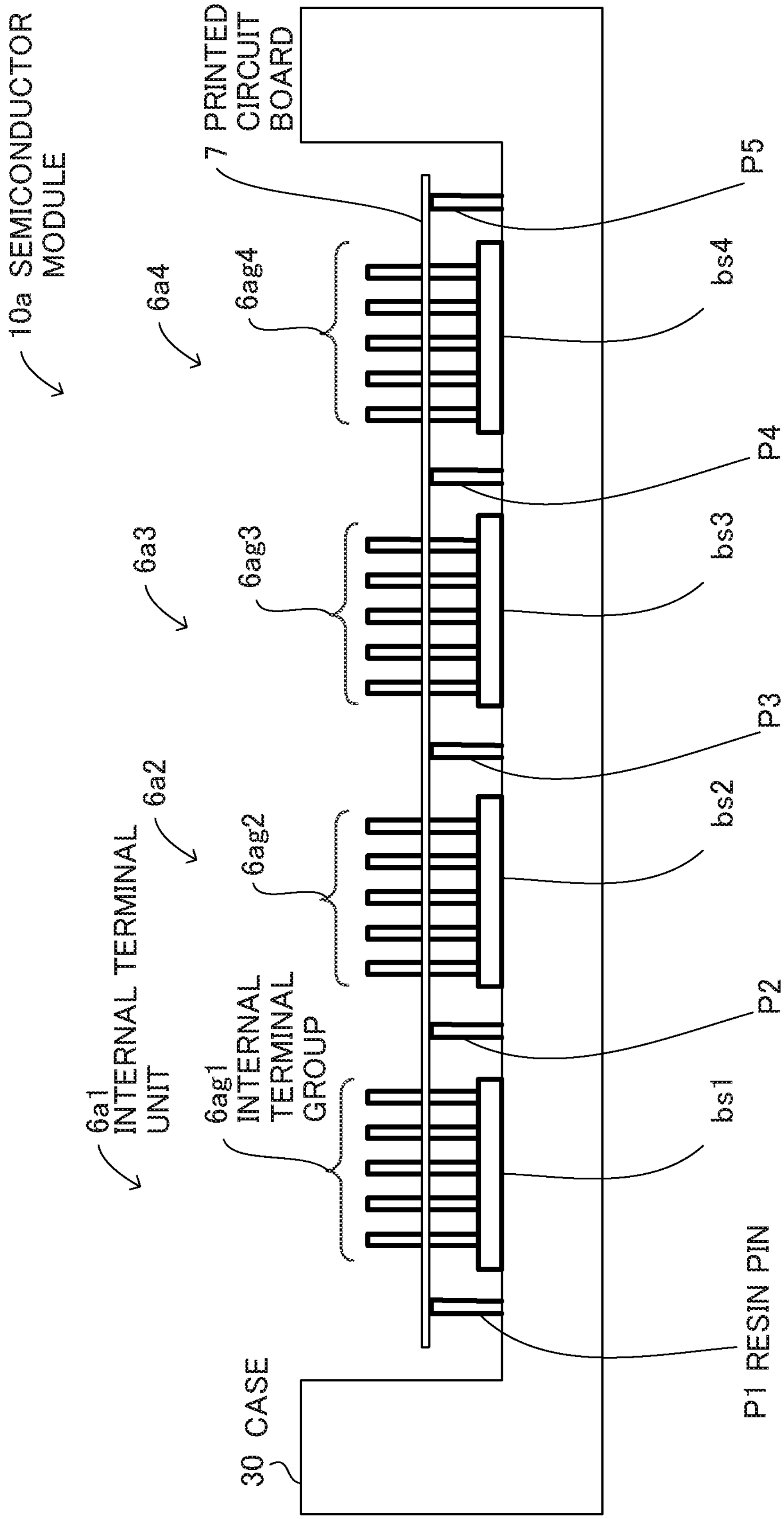
FIG. 16 Related Art
FIG. 16 illustrates a comparative example of a structure in which a printed circuit board is supported.

FIG. 15 illustrates an example of a structure according to an embodiment in which the printed circuit board is supported. FIG. 16 illustrates a comparative example of a structure in which a printed circuit board is supported. FIG. 15 illustrates a structure in which the printed circuit board 7 is supported on extended internal terminals. FIG. 16 illustrates a structure in which a printed circuit board 7 is supported on resin pins.

With the semiconductor module 10 illustrated in FIG. 15, internal terminal units 61 through 64 are located on the bottom of the case 30 (radiation plate, the insulating board, and the like are not illustrated). The internal terminal unit 61 includes the internal terminal group 61g and the extended internal terminal 61w having the level difference portion sp1 with respect to the base portion 61bs. The base portion 61bs and the case 30 made of resin are integrally formed.

Furthermore, the internal terminal unit 62 includes the internal terminal group 62g and the extended internal terminal 62w having the level difference portion sp2 with respect to the base portion 62bs. The base portion 62bs and the case 30 made of resin are integrally formed.

In addition, the internal terminal unit 63 includes an internal terminal group 63g and an extended internal terminal 63w having a level difference portion sp3 with respect to a base portion 63bs. The base portion 63bs and the case 30 made of resin are integrally formed.

Moreover, the internal terminal unit 64 includes an internal terminal group 64g and an extended internal terminal 64w having a level difference portion sp4 with respect to a base portion 64bs. The base portion 64bs and the case 30 made of resin are integrally formed. The printed circuit board 7 is pushed in to the level difference portions sp1 through sp4 of the extended internal terminals 61*w* through 64*w*. By doing so, the printed circuit board 7 is supported.

With a semiconductor module 10*a* illustrated in FIG. 16, internal terminal units 6*a*1 through 6*a*4 are located on the bottom of a case 30. The internal terminal unit 6*al* includes an internal terminal group 6*ag*1 with respect to a base portion bs1, and the base portion bs1 and the case 30 made of resin are integrally formed. Furthermore, the internal terminal unit 6*a*2 includes an internal terminal group 6*ag*2 with respect to a base portion bs2, and the base portion bs2 and the case 30 made of resin are integrally formed.

In addition, the internal terminal unit 6*a*3 includes an internal terminal group 6*ag*3 with respect to a base portion bs3, and the base portion bs3 and the case 30 made of resin are integrally formed. Moreover, the internal terminal unit 6*a*4 includes an internal terminal group 6*ag*4 with respect to a base portion bs4, and the base portion bs4 and the case 30 made of resin are integrally formed.

On the other hand, resin pins P1 through P5 are located on the bottom of the case 30. The internal terminal groups 6*ag*1 through 6*ag*4 are inserted into holes of a printed circuit board 7 and the printed circuit board 7 is pushed in to the upper surfaces of the resin pins P1 through P5. By doing so, the printed circuit board 7 is supported on the resin pins P1 through P5.

As stated above, according to the embodiment illustrated in FIG. 15, internal terminal units each including an extended internal terminal are located and a printed circuit board is supported on level difference portions. The resin pins P1 through P5 specializing in supporting the printed circuit board 7 may be eliminated compared with the structure illustrated in FIG. 16. As a result, the case 30 as a whole is miniaturized. Furthermore, the level difference portions sp1 through sp4 are formed by expanding the first pin width w1 in a direction opposite to the terminal arrangement direction of the internal terminal groups. Accordingly, there is no problem about ensuring insulation distance between internal terminals and extended internal terminals.

A low-cost printed circuit board of comparatively low strength (which is a thin printed circuit board having a thickness of about 1 mm, that is to say, a thickness of 0.9 to 1.3 mm and which is typically a single-layer printed circuit board) is adopted as the printed circuit board 7 used in the semiconductor module 10 according to the embodiment. That is to say, a printed circuit board for press-fitting (which is a printed circuit board having a thickness of about 1.7 mm or more, that is to say, a thickness of about 1.6 to 1.8 mm or more, which is typically a multilayer printed circuit board, and which withstands press-fitting) is not adopted. Terminals suitable for solder bonding are used as internal terminals and extended internal terminals included in internal terminal units. Even if the present disclosure is applied to a thick printed circuit board of high strength, there is no problem. However, it is preferable to apply the present disclosure to a printed circuit board of comparatively low strength having a thickness less than 1.4 mm.

According to an aspect, there is no need to locate pins specializing in supporting a printed circuit board and a module is miniaturized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:

a printed circuit board having a plurality of through holes; and an internal terminal unit including an internal terminal group including a plurality of internal terminals that are aligned in a predetermined direction and each have a first width in the predetermined direction, a part of each of the plurality of internal terminals passing through a corresponding one of the plurality of through holes of the printed circuit board, and an extended internal terminal that has a step formed by a first portion having the first width and a second portion having a second width greater than the first width in the predetermined direction, a part of the first portion passing through one of the plurality of through holes of the printed circuit board to support the printed circuit board by the second portion, wherein:

the extended internal terminal is located at a first end of the internal terminal unit that is opposite to a second end of the internal terminal unit in the predetermined direction; and the second portion further extends from the first portion in the predetermined direction from the second end toward the first end of the internal terminal unit.

2. The semiconductor module according to claim 1, wherein the printed circuit board has a thickness in a range of 0.9 to 1.3 mm, and the internal terminal group and the extended internal terminal are bonded to the printed circuit board.

3. The semiconductor module according to claim 1, further comprising a case that accommodates the printed circuit board and the internal terminal unit, wherein the internal terminal unit further includes a base that is integrated with the case, and the internal terminal group and the extended internal terminal provided at the base.

4. The semiconductor module according to claim 3, further comprising:

an insulating board provided in the case; and a plurality of circuit patterns formed over the insulating board, wherein each of the plurality of internal terminals of the internal terminal group and the extended internal terminal has a bent portion that is bent perpendicularly to the predetermined direction inside the base and is exposed from the base, the bent portion being connected by wire bonding to one of the plurality of circuit patterns.

5. The semiconductor module according to claim 1, further comprising first solder fillets and second a second solder filet, wherein:

the printed circuit board has a front surface and a back surface opposite to each other;

the first solder fillets each have a first solder amount and respectively bond the plurality of internal terminals of the internal terminal group and the extended internal terminal other than the step to the printed circuit board from either one of the front surface or the back surface of the printed circuit board; and the second solder fillet has a second solder amount smaller than the first solder amount and bonds the extended internal terminal to the printed circuit board between the step of the extended internal terminal and the back surface of the printed circuit board.

6. The semiconductor module according to claim 1, wherein the plurality of internal terminals of the internal terminal group and the extended internal terminal are respectively electrically connected to a plurality of wirings formed over the printed circuit board via solder provided at the plurality of through holes to bond the internal terminal unit to the printed circuit board.

7. The semiconductor module according to claim 1, wherein in the internal terminal unit, the plurality of internal terminals of the internal terminal group and the extended internal terminal are aligned in the predetermined direction with constant intervals of a third width larger than the first width between them.

* * * * *